United States Patent [19]

Hyslop et al.

[11] Patent Number: 4,627,033

[45] Date of Patent: Dec. 2, 1986

[54] SENSE AMPLIFIER WITH REDUCED INSTANTANEOUS POWER

[75] Inventors: Adin E. Hyslop, Houston; Charvaka Duvvury, Missouri City, both of Tex.

[73] Assignee: Texas Instruments Incorporated, Dallas, Tex.

[21] Appl. No.: 636,940

[22] Filed: Aug. 2, 1984

[51] Int. Cl.$^4$ .............................................. G11C 7/00
[52] U.S. Cl. .................................... 365/205; 365/203
[58] Field of Search ................ 365/205, 203, 210, 222

[56] References Cited

U.S. PATENT DOCUMENTS 4,195,357  3/1980  Kuo et al. ........................... 365/210

OTHER PUBLICATIONS

IBM Technical Disclosure Bulletin–vol. 25, No. 10, Mar. 1983, pp. 5088–5091.

Primary Examiner—James W. Moffitt
Attorney, Agent, or Firm—John G. Graham

[57] ABSTRACT

A CMOS sense amplifier circuit for a dynamic read/write memory employs cross-coupled N-channel transistors and cross-coupled P-channel transistors, returned to the voltage supply and ground through two separate sets of P and N channel transistors selectively activated by sense clocks. The return transistors are activated for either fast or slow sensing, depending upon the address input. The selected columns are sensed at maximum speed, and non-selected columns which are only being refreshed are sensed at a slower speed. A large return transistor is switched into the circuit only for fast sensing, and other smaller transistors perform the slow sense function with high resistance returns to the supply so peak current is lower. The current needed to charge and discharge the bit lines is thus spread out, and the peak current is decreased.

13 Claims, 9 Drawing Figures

SENSE AMPLIFIER WITH REDUCED INSTANTANEOUS POWER

RELATED CASES

This application discloses subject matter also disclosed in copending applications Ser. Nos. 636,938 and 635,939, filed Aug. 2, 1984, all assigned to Texas Instruments.

BACKGROUND OF THE INVENTION

This invention relates to semiconductor devices, and more particularly to sense amplifier circuits for dynamic read/write memory devices.

Dynamic MOS read/write memory devices have been constructed generally as shown in U.S. Pat. No. 4,081,701 (a 16K dynamic RAM) issued to White, McAdams and Redwine, or U.S. Pat. No. 4,239,993 (a 64K dynamic RAM) issued to McAlexander, White and Rao, both assigned to Texas Instruments. When memory devices of this type are manufactured in higher densities, such as 256K and 1-Megabit and beyond, the problem of limiting the peak current supplied to the chip becomes formidable.

In a 1-Megabit DRAM that is refreshed at 512 per period, there are 2048 sense amplifiers which flip at the same time during an active cycle. Each one of these requires current to charge a bit line to Vdd, or discharge a bit line to Vss, or both, depending upon the precharge level. The voltage supply to the chip thus sees a very large current spike in a short time period; as the access time is increased, the magnitude of the current spike increases. In U.S. Pat. No. 4,050,061, issued to Nori Kitagawa, assigned to Texas Instruments, a technique is disclosed for limiting the peak curent by partitioning the array into blocks and activating the sense amplifiers fully in only the addressed block; the other blocks are activated at a lower level and operate more slowly.

It is the principal object of this invention to provide an improved sense amplifier circuit for high density dynamic RAM devices, particularly for high-speed, low power devices. Another object is to provide a sense amplifier circuit for a CMOS dynamic RAM in which the peak current is minimized. A further object is to provide high speed, low current circuitry for semiconductor devices which contain bistable or latch circuits and the like.

SUMMARY OF THE INVENTION

In accordance with one embodiment of the invention, a CMOS sense amplifier circuit for a dynamic read/write memory employs cross-coupled N-channel transistors and cross-coupled P-channel transistors, returned to the voltage supply and ground through two separate sets of P and N channel transistors selectively activated by sense clocks. The return transistors are activated for either fast or slow sensing, depending upon the address input. The selected columns are sensed at maximum speed, and non-selected columns which are only being refreshed are sensed at a slower speed. A large return transistor is switched into the circuit only for fast sensing, whereas other smaller transistors perform the slow sense function with high resistance returns to the supply so peak or instantaneous current is lower. The current needed to charge and discharge the bit lines is thus spread out, and the peak current is decreased.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
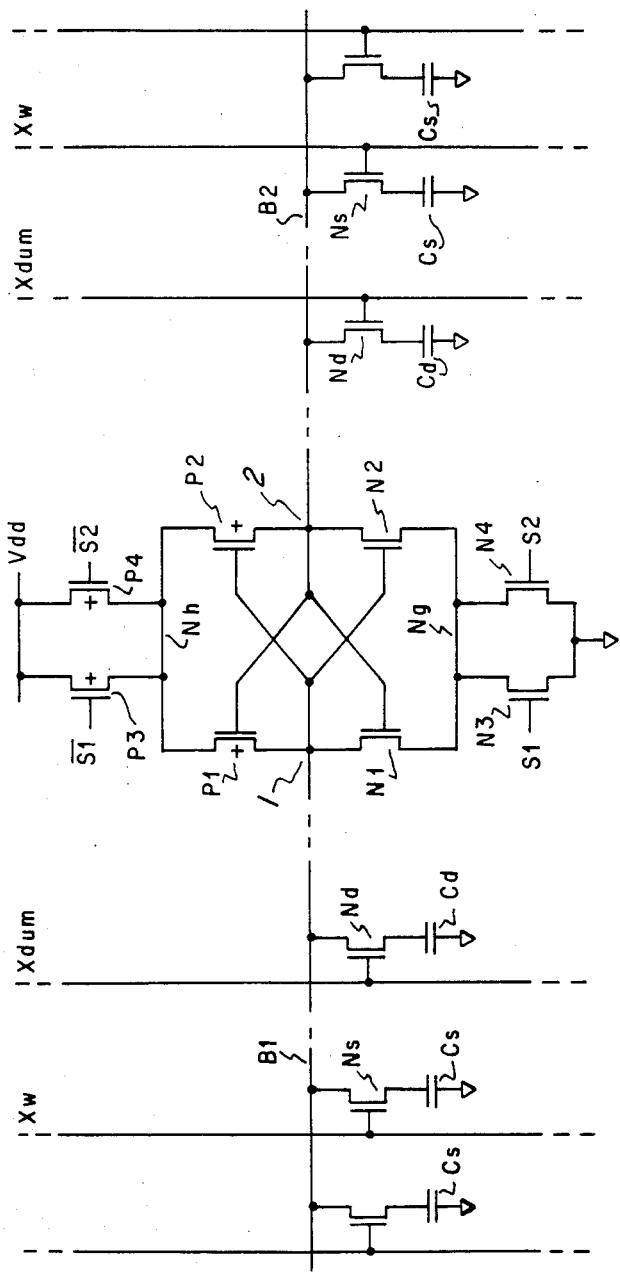
FIG. 1 is an electrical schematic diagram of a sense amplifier circuit according to the invention.

Referring to FIG. 1, a sense amplifier circuit for a dynamic RAM array is illustrated according to one embodiment of the invention. The sense amplifier in this example employs a CMOS cross-coupled flip-flop circuit having a pair of N-channel driver transistors N1 and N2 and a pair of P-channel pull-up transistors P1 and P2. The N-channel transisors are coupled to ground through a pair of N-channel transistors N3 and N4 having sense clocks S1 and S2 coupled to their gates, and the P-channel transistors are coupled to Vdd through a pair of P-channel transistors P3 and P4 having $\overline{S1}$ and $\overline{S2}$, the complements of the sense clocks $\overline{S1}$ and $\overline{S2}$, on their gates. Sense nodes 1 and 2 at the drains of the N-channel transistors are coupled to bit lines B1 and B2.

The bit lines B1 and B2 are each coupled to a large number of one-transistor memory cells, each memory cell having a storage capacitor Cs and an N-channel access transistor Ns. One cell is selected by an Xw voltage on a word line. There is a dummy cell on each line, including a dummy capacitor Cd and an access transistor Nd. A dummy row line on the side opposite the selected word line is activated by an Xdum voltage.

Figure 2:
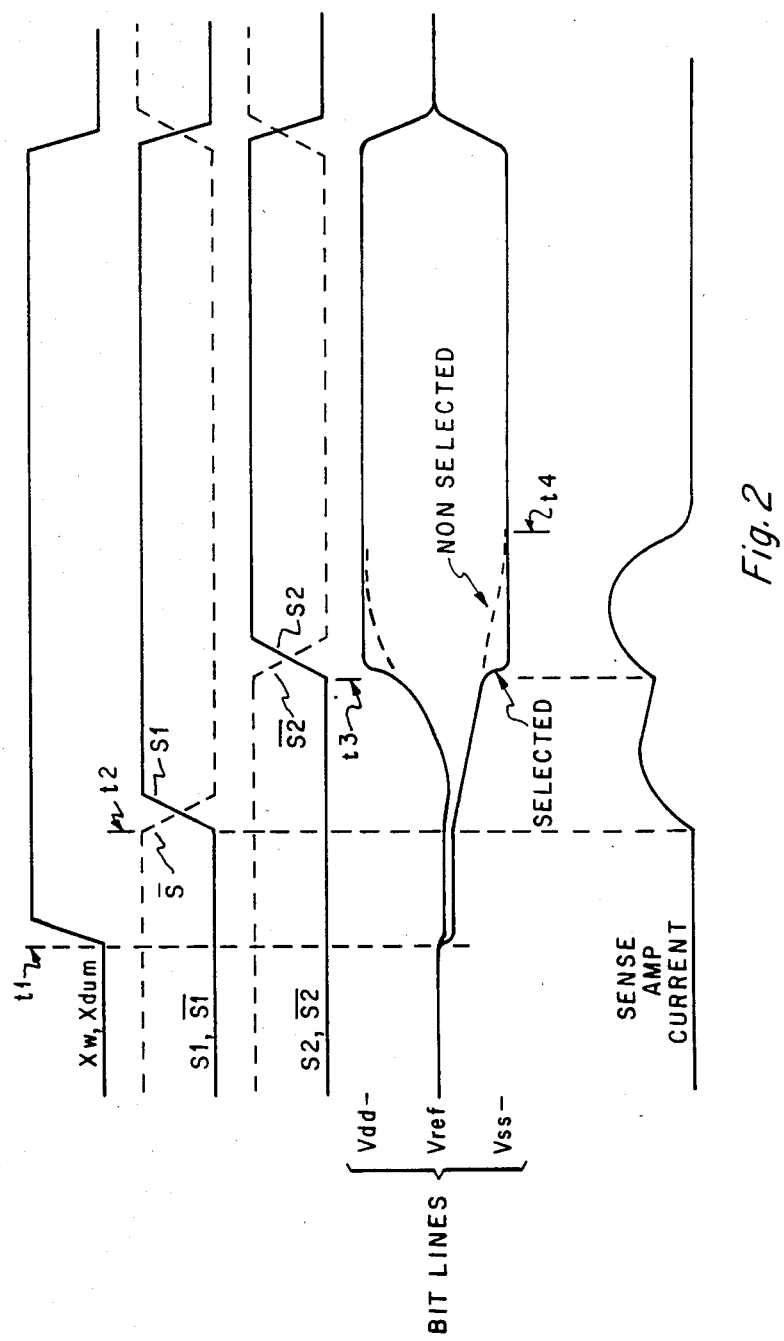
FIG. 2 is a timing diagram showing voltage vs. time for various nodes in the circuit of FIG. 1.

The sequence of operation of the elements of the sense amplifier of FIG. 1 is shown in the timing diagram of FIG. 2 for one example. The selected Xw and Xdum voltges go from zero to the Vdd level at time t1, turning on one transistor Ns and one transistor Nd, on opposite sides of the sense amplifier. This causes the bit lines B1 and B2 to charge-share with the storage capacitor Cs on one side and the dummy capacitor Cd on the other. The precharge level and size of these capacitors are such that the voltage on the bit line with Cs connected to it will be above or below the one on the dummy side, depending upon whether a 1 or a 0 is stored; the bit lines and sense nodes thus separate in voltage just after t1. This voltage differential is maintained for a time on the capacitance of the nodes 1 and 2 (including the gates of transistors N1, N2, P1, P2).

The circuit of FIG. 1 may be operated using N-channel sensing or P-channel sensing. Assuming N-channel type is used, at time t2 the sense clock S1 goes to Vdd, and S1 drops, turning on transistors N3 and P3 and causing the cross-coupled flip-flop circuit to begin to operate at a high impendence level i.e., low gain; one of the nodes 1 and 2 decays slowly toward zero and the other goes toward Vdd. There is little current drain at this point because the series resistance of the transistors N3 and P3 is high. One of the larger transistors N4 or P4 must be turned on to force the bit lines B1 and B2 to a full Vdd and zero level for fast sensing. To this end, according to the example of N-channel sensing, the voltage S2 goes to Vdd at time t3, if this is a selected column. The zero-going bit line B1 or B2 discharges rapidly through N-channel transistor N1 or N2, and large transistor N4, to ground; the one-going bit line is charged rapidly through P-channel transistor P1 or P2 and transistor P3 from the Vdd supply. That is, in this example of N channel sensing the large transistor P4 is not used; however, for P-channel sensing, on the other hand, the transistor P4 is activated by $\overline{S2}$ at t3, but transistor N4 is not used.

The time needed to reach a full rail-to-rail separation of the bit lines without bringing in the large high gain transistor N4 (or P4), illustrated as time t4 in FIG. 2, is too long for achieving reasonably fast access times in dynamic RAMs, but it is adequate for the refresh operation. Thus, in a large DRAM where the number of cells in a row being accessed for refresh is larger than the number being accessed for data I/O, the sense amplifiers can have the S2 (or $\overline{S2}$) voltage selectively applied. When S2 is applied, the zero-going side will drop quickly to zero at t3 as seen in FIG. 2; the data bit can be sensed for a read operation much sooner than t4 in this situation.

The bit lines B1 and B2 are coupled to the data I/O circuitry by column select transistors, not shown. For the selected column or columns, the bit lines are driven further apart at time t3, so the data bit can be coupled to the data output circuitry for output from the chip. The other columns, not selected for fast sensing are merely refreshed, so the time delay to t4 is of no disadvantage, because there is ample time before the end of an active read cycle.

The current flow into and out of the chip on the Vdd and Vss lines, isolated to the contribution by the sense amplifiers, is also illustrated in FIG. 2. There is no current in the sense amplifiers until t2, and this current pulse at t2 is small because the series resistance is high. At t3 there is a current pulse, as the selected bit lines are charged or discharged rapidly, but the current for the non-selected bit lines is spread over a longer time, so the peak current is smaller. There would be, of course, other current peaks (not shown) when $\overline{RAS}$ drops, when $\overline{CAS}$ drops, and when $\overline{RAS}$ goes high (precharge begins).

Figure 3:
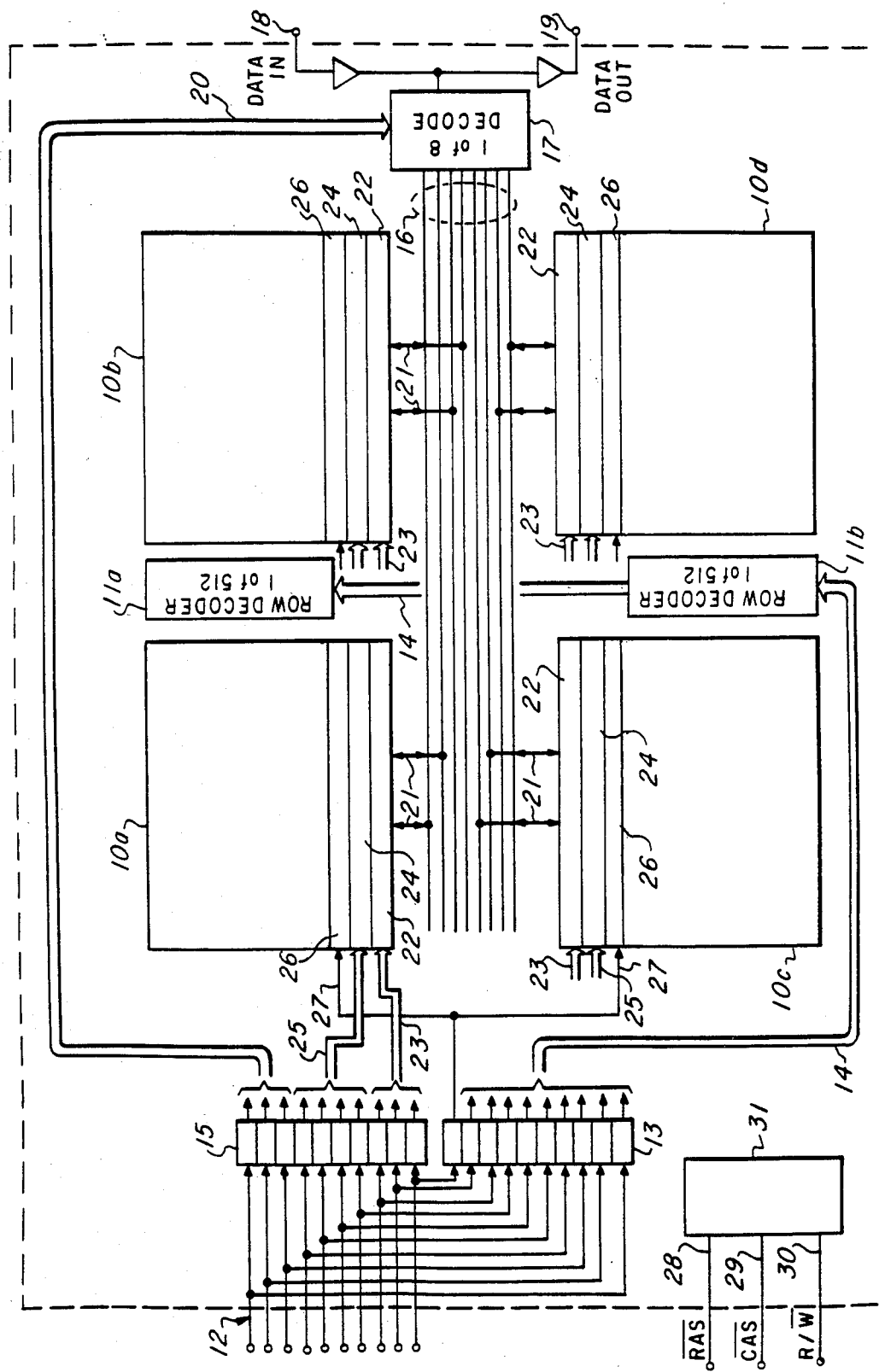
FIG. 3 is an electrical diagram in block form of a dynamic memory device of the 1-Megabit size which may use the sense amplifier circuit of the invention.

Referring to FIG. 3, a block diagram of one example of a semiconductor dynamic read/write memory chip is illustrated which may use the sense amplifier circuit constructed according to another embodiment of the invention. This device is of the so-called 1-Megabit size, having $2^{20}$ or 1,048,576 memory cells in an array of rows and columns. The array is partitioned into four identical blocks 10a, 10b, 10c and 10d, with each block containing 262,144 cells. Within each block, there are 512 row lines, and all row lines are connected to one of the row decoders 11a or 11b. Each row decoder 11a or 11b receives 9-bits of a 10-bit row address from address input pins 12 by way of row address latches 13 and lines 14; the row decoders produce the row select voltage Xw as above. A 10-bit column address is also applied to the input pins 12, in time-multiplexed manner, and this column address is coupled to buffers 15. Eight data I/O lines 16 are positioned in the center of the array, and one of these eight is selected for data input or output by a 1-of-eight selector 17; a single I/O line from this selector 17 is connected through buffers to the data-in pin 18 and the data-out pin 19. The selector 17 receives three bits of the column address by lines 20 from the column address buffers 15. Two of the eight lines 16 are connected respectively to each of the blocks 10a, 10b, 10c and 10d by I/O lines 21. A 2-of-16 column selection is made in sixteen intermediate output buffers 22 for each block, using three bits of the column address on lines 23 from buffers 15. A 1-of-16 column selection is made in each of sixteen sets of sixteen intermediate output buffers 24 in each block 10a–10d, using four bits of the column address on lines 25 from buffers 15. Each one of 512 sense amplifiers 26 (like FIG. 1) in each block is connected to one of the columns in the array (each column is made up of two column line halves or "bit lines"). Each buffer 24 is coupled to one of two columns; this selection is based on one bit of the row address from buffers 13 on line 27.

Figure 3A:
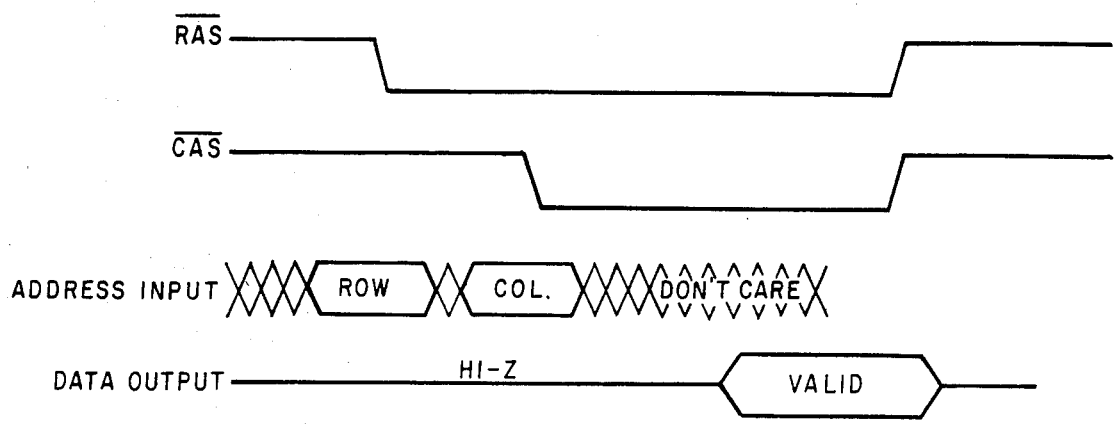
FIG. 3a is a timing diagram for the read or write operation of the memory of FIG. 3.

The memory device receives a row address strobe $\overline{RAS}$ on input pin 28, and a column address strobe $\overline{CAS}$ on input pin 29. Selection of a read or a write operation is made by a $R/\overline{W}$ control on an input pin 30. A clock generator and control circuit 31 produces all of the internal clocks and controls as needed. For a single-bit read (or write), $\overline{RAS}$ and $\overline{CAS}$ drop to zero in sequence as illustrated in FIG. 3a, and a one-bit data read (or write) occurs.

Each block of the array contains two rows of dummy cells 32 in the usual manner, as discussed in the above-mentioned U.S. Pat. Nos. 4,239,993 or 4,081,701.

Figure 4:
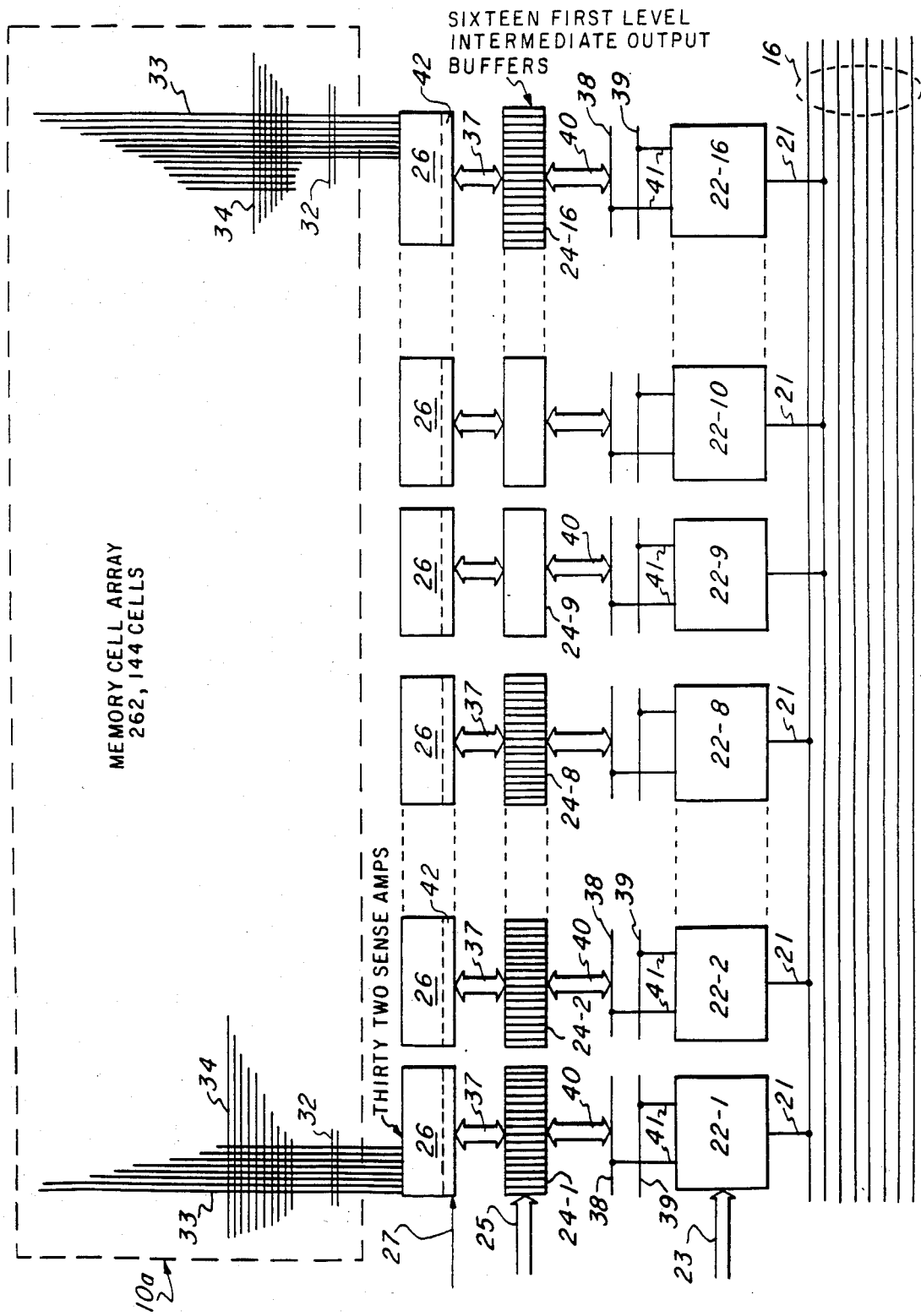
FIG. 4 is an electrical diagram in block form of a part of the memory device of FIG. 3.

Referring to FIG. 4, the I/O lines 16, the intermediate output buffers 22 and 24, and the sense amplifiers 26 are shown in more detail for a part of one of the blocks 10a–10d. In a given block, there are sixteen of the intermediate output buffers 22, in this figure labelled 22-1–22-16. Note that buffers 22-1 through 22-8 are in one group of eight associated with one of the lines 16 for this block, and the buffers 22-9 through 22-16 are in another group of eight connected with the other one of the lines 16 for this block by lines 21. For each one of the sixteen buffers 22-1-21-16, there is a set of sixteen buffers 24; here these sets are labelled 24-1 through 24-16 (sixteen in each set). For each set of sixteen buffers 24, a group of thirty-two sense amplifiers 26 is provided, and each sense amplifier 26 is connected to two of the bit lines 33 (one column equals two bit lines, corresponding to the bit lines B1 and B2 of FIG. 1). Intersecting the bit lines 33 are 512 row lines 34 in the memory cell array. The dummy row lines 32 also intercept the bit lines 33, as will be described. One of the two dummy lines is selected by the row decoder 11a, 11b using one bit of the nine-bit row address 14.

The tenth bit of the row address from buffers 13 is applied by the line 27 to a multiplex circuit for the sense amplifiers 26 to select which one of the two sense amplifiers of each pair is connected to the respective first level intermediate buffer 24 by lines 37. There are sixteen pairs of data/data-bar lines 38 and 39 in this block, each pair being coupled to the selected buffers 24 on one side by lines 40 and connected to the selected buffers 22 on the other side by lines 41. Note that the I/O changes from double-rail at the lines 38 and 39 to single rail at the data I/O lines 16, for a write operation.

Figure 5:
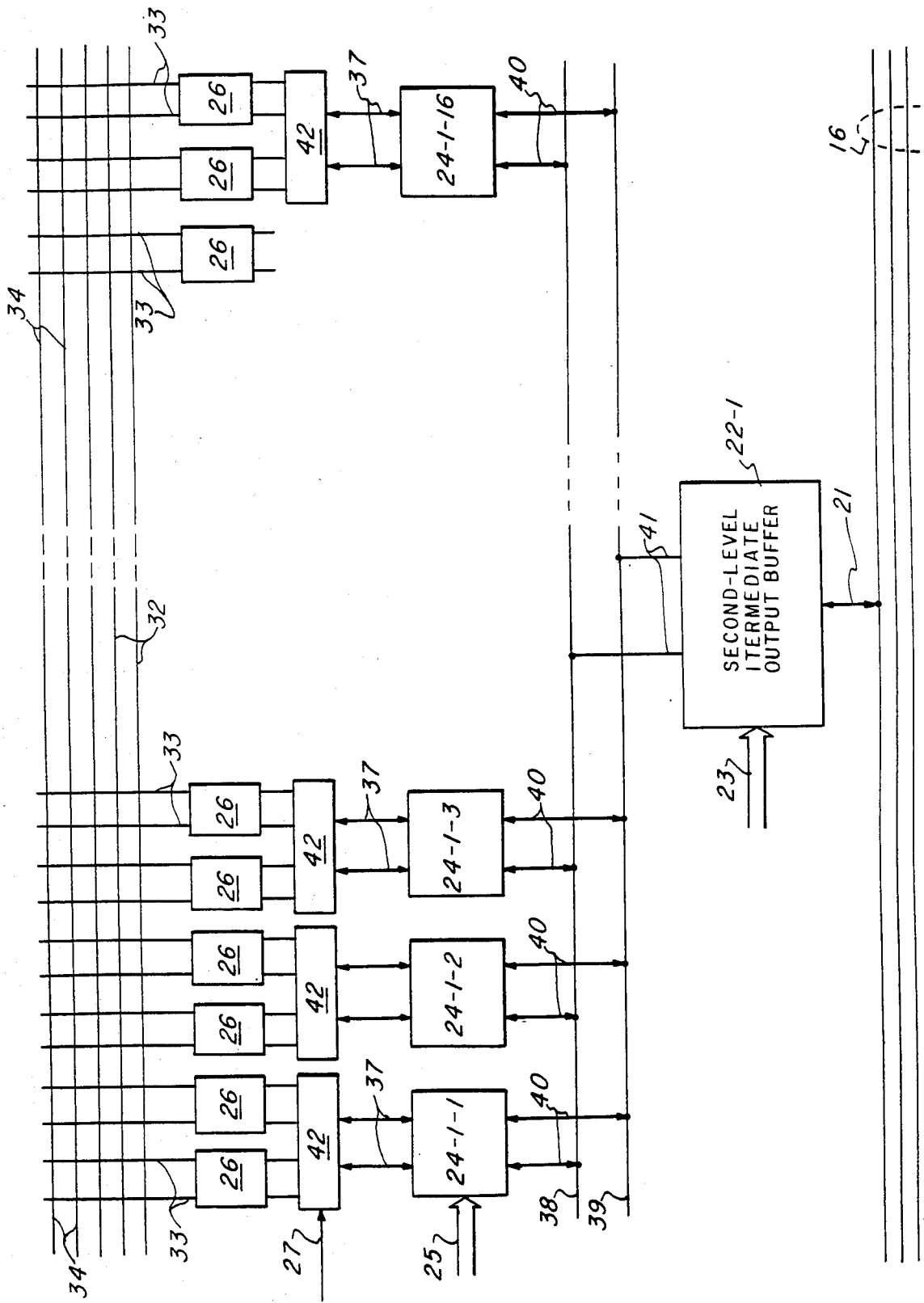
FIG. 5 is an electrical diagram in block form of a part of the circuitry of FIG. 4.

Referring to FIG. 5, a part of the circuitry of FIG. 4 is shown in more detail. The sense amplifiers 26 associated with the set of sixteen buffers 24-1 are shown. There are actually thirty-two sense amps 26 for this set. This set of sixteen buffers 24-1 is labelled 24-1-1 through 24-1-16 in this figure. Each individual sense amplifier 26 has two bit lines 33 extending from it, in the so-called folded bit line configuration. Thus, all word lines 34 and both dummy rows 32 are on the same side of the sense amp. The row lines 34 intersect the bit lines, and memory cells are at intersections of row or word lines and bit lines just as in FIG. 1, but folded. A multiplexer 42 for each pair of sense amplifiers 26 selects one, based on the address bit on line 27, for connection to the respective buffer 24-1-1, 24-1-2, etc., by lines 37. Only one of the sixteen buffers 24-1-1 through 24-1-16 is selected at any one time, based on the four column address bits on lines 25, so only one will be operating to couple a read-or-write bit of data to or from the lines 38, 39 by lines 40. The buffer 22-1 of FIG. 5 may or may not be selected by the 2-of-16 select provided by three bits on lines 23, for coupling the dual-rail I/O lines 38, 39 to the single rail I/O line 16 for this group.

Figure 6:
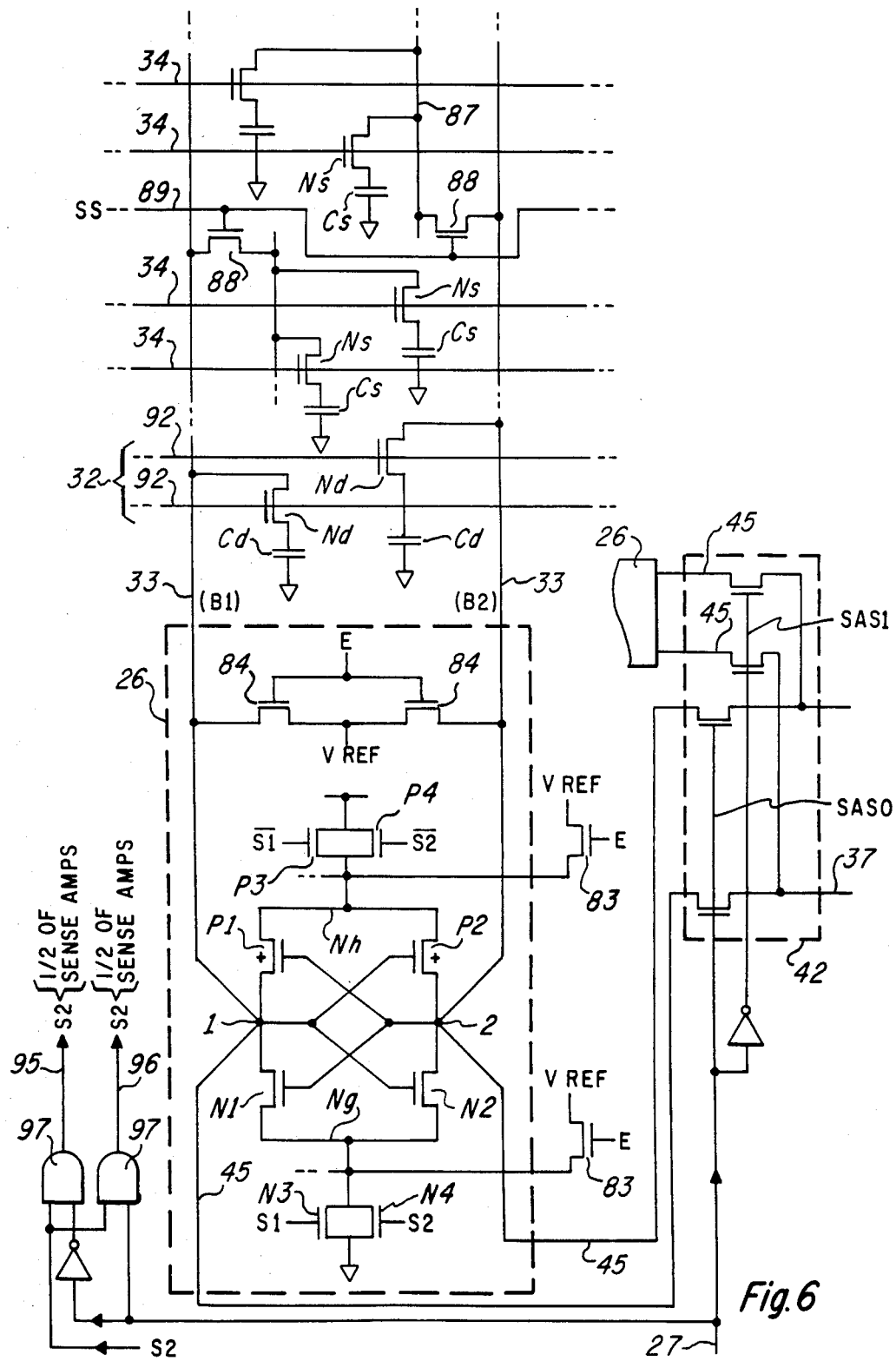
FIG. 6 is an electrical diagram in schematic form of the sense amplifier and cell array of FIGS. 3-5.

Referring to FIG. 6, one of the sense amplifiers 26 constructed according to the invention is shown in detail. This figure also shows the two bit lines 33 for this sense amplifier and four of the 512 row lines 34 perpendicular to these bit lines. The sense amplifier employs a CMOS cross-coupled flip-flop like FIG. 1 having N-channel driver transistors N1 and N2 and P-channel pull-up transistors P1 and P2. Sense nodes 1 and 2 are connected to bit lines 33. A node Ng on the ground side of this flip-flop is coupled to ground through two N-channel transistors N3 and N4, which have sense clocks S1 and S2 on their gates. The transistor N3 with S1 on its gate is much smaller than the other transistor N4, and clock S1 occurs first, so the initial sensing is a lower-gain condition. On the Vdd side, a node Nh is coupled to the supply through P-channel transistors P3 and P4, which have sense clocks $\overline{S1}$ and $\overline{S2}$ on their gates. (The circuit is shown in a form that could use either N-channel or P-channel sensing, like FIG. 1; in an actual circuit, one would be chosen, so either transistor N4 or transistor P4, and its clock S2 or $\overline{S2}$ would be omitted.) The sense clocks $\overline{S1}$ and $\overline{S2}$ are the complements of S1 and S2, so the P-channel transistors P3 and P4 start to operate only when when the clocks S1 and S2 are activated. There is a two-interval sense operation, first at S1 (at a low current level), then at S2 (or $\overline{S2}$). The transistors N3 and N4, as well as P3 and P4, can be unique to each sense amp, or alternatively can be shared with all of the other sense amplifiers 26 in two blocks 10a and 10b, i.e., 1024 sense amplifiers. The nodes Ng and Nh are precharged to about one-half Vdd by a transistors 83 when E is high.

The bit lines 33 are precharged and equalized through three transistors 84 which have an equalize clock voltage E on their gates; two of these transistors 84 have their sources connected to a reference voltage Vref. The value of this reference voltage is about half Vdd, so little or no net charge is needed from the chip supply Vdd to precharge all of the bit lines. That is, one line 33 will be high and the other low for each sense amplifier, so one will charge the other, and Vref need only supply any differential that might have occurred. The clock E is generated in the control circuitry 31 after the end of an active cycle, when $\overline{RAS}$ goes high.

Each of the memory cells of FIG. 6 consists of a capacitor Cs and an access transistor Ns, just as in FIG. 1, with the gates of all of the 512 access transistors Ns in a row being connected to a row line 34. Only one row line 34 of 512 in the block is turned on at any one time, so only one memory cell capacitor Cs is connected to a bit line 33 for a given sense amplifier 26. According to the invention of application Ser. No. 634,898 filed July 26, 1984 by David J. McElroy, assigned to Texas Instruments, in order to reduce the ratio of the bit line capacitance to the value of the storage capacitance Cs, a number of bit line segments 87 are employed for each pair of bit lines 33. One of these segments 87 is coupled to a bit line 33 at a given time by one of the transistors 88. For example, each segment 87 may have thirty-two cells connected to it, so in the embodiment disclosed herein there must be sixteen of these segments 87 for each sense amplifier ($16 \times 32 = 512$). Half of the segments are connected to one bit line and half to the other. The row decoder 11a or 11b selects the appropriate one of sixteen lines 89 by a segment select voltage SS, at the same time as this decoder selects 1-of-512 row lines 34, based on certain ones of the same nine address bits from lines 14.

In the dummy rows 32, a pair of dummy cells are provided for each pair of bit lines 33, and these dummy cells consist of dummy capacitors Cd and access transistors Nd as before. When the selected storage cell is on the left-hand bit line 33, then the right-hand dummy cell is selected in the row decoders 11a, 11b by one of the decoder output lines 92, and vice versa, in the usual manner. One bit of the row address is used in the row decoder to select one or the other of these lines 92 of the dummy cell rows 32.

Figure 7:
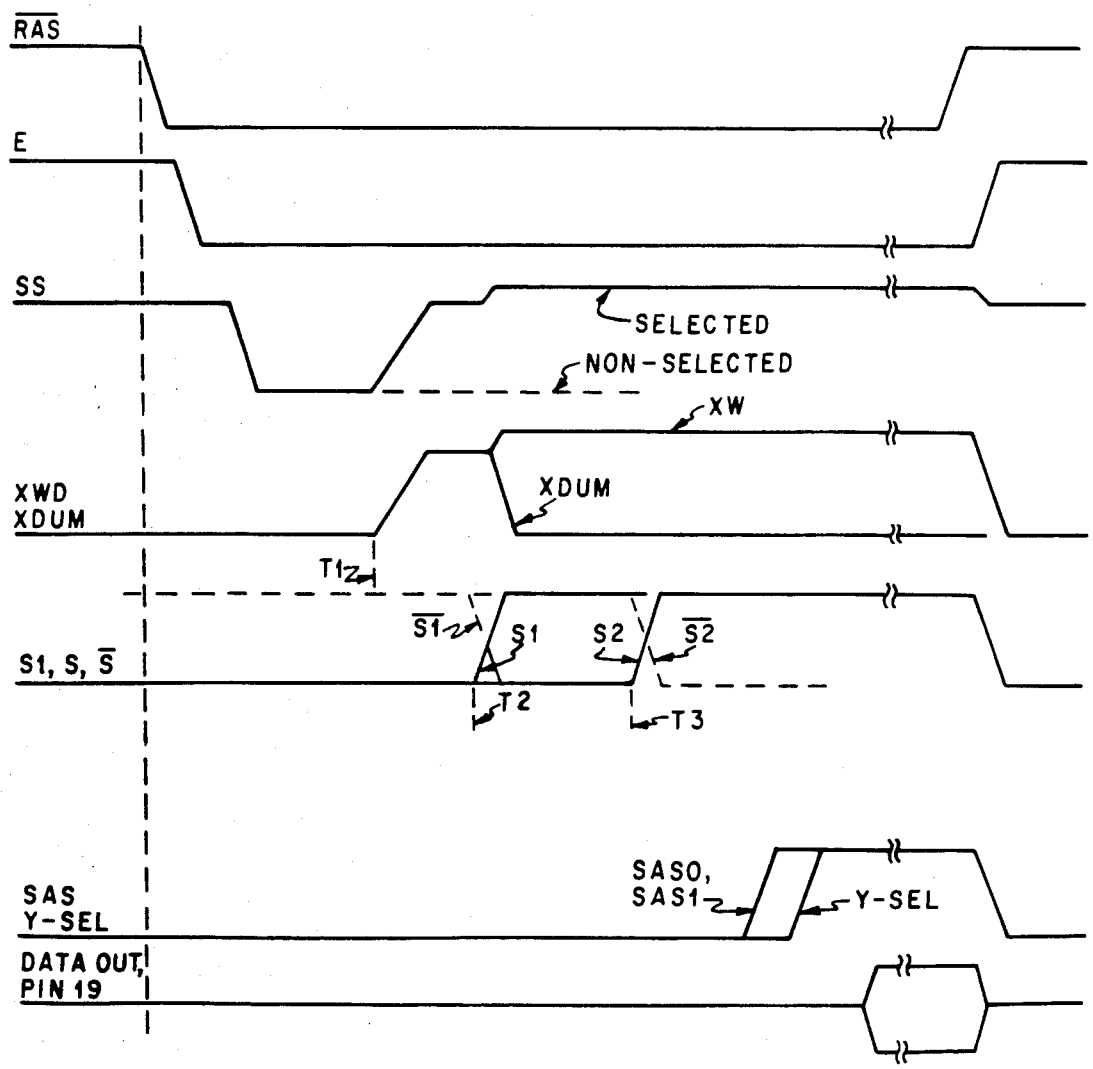
FIG. 7 is a timing diagram showing voltage vs. time for various nodes in the circuit of FIGS. 3-6.

Referring to FIG. 7, the sequence of operation of the memory device will be explained for a single-bit read operation. An active cycle begins wih the $\overline{RAS}$ voltage dropping from $+5$ to zero. This example is a read cycle, so at this time the $R/\overline{W}$ input voltage is at $+5$. The time prior to this is a precharge cycle, during which the equalize voltage E has been high, so all of the bit lines 33 and the nodes Ng and Nh, have been precharged to the Vref voltage, assumed to be about $\frac{1}{2}$ Vdd or $+2.5$. The segment select signal SS on all of the lines 89 is high, so all of the segments 87 are also precharged to the Vref voltage. The dropping of $\overline{RAS}$ causes the equalize voltage E to drop, isolating the pairs of bit lines 33 from each other and from Vref. The segment select signal SS then drops, isolating all of the segments 87 from the bit lines 33. As soon as the row decoders 11a, 11b have had time to respond to the row address, at time t1 the Xw and Xdum voltages start to rise on the selected 1-of-512 row line 34 and selected 1-of-2 dummy line 92; at the same time t1, the segment-select signal SS on one of the lines 89 is brought up. These address voltages Xw, Xdum and SS are brought up rather slowly, and later, some time after reaching the Vdd level, SS and Xw are boosted above Vdd to eliminate the Vt drop across the access transistors Ns and 88. The Xdum voltage falls, since the function of the dummy cells is completed during initial sensing, and the dummy capacitors can be decoupled from the bit lines so these capacitors can be precharged, as disclosed in U.S. Pat. No. 4,547,868, filed July 26, 1984 by Childers and Hyslop, or Ser. No. 630,507, filed July 11, 1984 by Tran, McAdams and Childers, both assigned to Texas Instruments. At time t2, the sense amplifiers 26 are first activated (at low level) by the S1 voltage going high, turning on the high-impedance N-channel transistor N3 and the high impedance P-channel transistor P3; this begins to separate the bit lines 33 further than the separation caused by the differential voltages on the storage cell and dummy cell. At this point only a minimum current flows from the supply Vdd or to ground through transistors N1, N2, P1 and P2. For the selected sense amplifiers, the sense voltage S2 is brought up (or $\overline{S2}$ drops) at t3, so the large transistor N4 (or P4) begins to conduct, forcing the bit lines more rapidly toward a rail-to-rail condition; one bit line 33 goes high and the other toward zero. The sense-amp-select voltage SAS1 or SAS2 (selected by address bit 27) is turned on, connecting one of the sense amplifiers to a buffer 24 via lines 37 of FIG. 5, using the multiplexer 42. Just after this the Y-select outputs from column decoders are valid, so the selected data bit become valid on the line 16, and shortly thereafter the data bit is valid on the output pin 19.

Selection of which of the sense amplifiers is activated for high current sensing occurs is based upon an address bit. In the embodiment of FIGS. 3–7 there are 2048 sense amplifiers; half of these (including the selected columns) may receive the sense clock S2 (or $\overline{S2}$), the other half not. One way of accomplishing this is by using the address bit on line 27, the same one used in the multiplexer 42 that selects the sense amplifier 26 for connection to the I/O circuitry. As seen in FIG. 6, all of the sense amplifiers selected by SAS0 have the sense clock voltage S2 applied by line 95, and those selected by SAS1 receive the sense clock voltage S2 from line 96. A pair of logic gates 97 receiving the address bit 27 and its complement, and the sense clock voltage S2, apply the proper voltage to the transistors N4 (or P4). The current pulse for charging and discharging all of the 2048 pairs of bit lines is thus spread over twice the time, reducing peak current.

While this invention has been described with reference to illustrative embodiments, this description is not intended to be construed in a limiting sense. Various modifications of the illustrative embodiments, as well as other embodiments of the invention, will be apparent to persons skilled in the upon reference to this description. It is therefore contemplated that the appended claims will cover any such modifications or embodiments as fall within the true scope of the invention.

What is claimed:

1. A sense amplifier circuit for a memory device, comprising:
   a pair of bit lines, and a plurality of memory cells connected to each of said bit lines,
   a cross-coupled latch circuit, having a grounding node and a positive voltage supply node, and having a pair of sense nodes,
   grounding means including first transistor means and voltage supply means including second transistor means, said first transistor means being a pair of N-channel transistors and said second transistor means being at least one P-channel transistor, each transistor of said transistor means having a source-to-drain path and a gate, the source-to-drain paths of the first transistor means connected between said grounding node and grounding means, the source-to-drain paths of the second transistor means connected between said voltage supply node an voltage supply means,
   means a coupling said pair of sense nodes to said pair of bit lines,
   and control means selectively activating said gates of one of said transistors of said first transistor means at a first time in an active cycle after said memory cells are activated, then activating the gate of the other of said transistors of said first transistor means and the gate of said at least one transistor of said second transistor means at a second time after said first time in said operating cycle.

2. A circuit according to claim 1 wherein said latch circuit is a CMOS latch with a second pair of N-channel driver transistors and a second pair of P-channel transistors.

3. A circuit according to claim 2 wherein said control means activates said selected ones of said gates of said transistor means at said second time after said first time depending upon an address applied to said memory device.

4. A circuit according to claim 3 wherein said memory cells are one-transistor dynamic MOS read/write memory cells.

5. A sense amplifier circuit for a semiconductor memory array which has row lines for selecting cells based on an address, and has bit lines perpendicular to the row lines and connected to the cells, comprising:
   a bistable latch circuit having differential inputs, and having first and second power supply nodes, each of the differential inputs being coupled to one of said bit lines for sensing the voltage thereon,
   first and second N-channel transistors having gates, and having source-todrain paths connected in parallel between said first power supply node and a ground terminal of a power supply, said first transistor being of high resistance and having its gate connected to a first clock voltage, said second transistor being of low resistance and having its gate connected to a second clock voltage.
   a third P-channel transistor having a gate and having a source-to-drain path connected between said second power supply node and a positive terminal of said power supply, said third transistor being of high resistance and having its gate connected to a third clock voltage,
   clock means applying said first clock voltage to the gate of said first transistor at a given time in an operating cycle, and for selectively applying said second clock voltage to the gate of said second transistor at a time later in said operating cycle, and thereafter applying said third clock voltage to the gate of said third transistor later in such operating cycle.

6. A circuit according to claim 5 including control means responsive to said address for selectively applying said second clock voltage to the gate of said second transistor at a time in said operating cycle after said given time.

7. A circuit according to claim 5 wherein said bistable latch comprises a pair of cross-coupled N-channel transistors and a pair of cross-coupled P-channel transistors.

8. A circuit according to claim 7 wherein said pair of cross-coupled P-channel transistors have source-to-drain paths separately connecting said differential inputs to said second power supply node.

9. A circuit according to claim 8 wherein applying only said first and third clock voltages produces a slow sensing operation; and applying said first, second and third clock voltages produces a fast sensing operation.

10. A circuit according to claim 9 wherein said cells are dynamic read/write memory cells.

11. A semiconductor memory device containing an array of rows and columns of memory cells partitioned in groups containing row lines for selecting cells within a group based on an address, and containing bit lines perpendicular to the row lines and connected to the cells; said device comprising:

(a) a plurality of sense amplifiers, each sense amplifier including a bistable latch circuit having differential inputs, and having a positive supply node and a grounding node, each of the differential inputs being coupled to one of said bit lines for sensing the voltage thereon, (b) first and second N-channel transistors having gates, and having source-to-drain paths connected in parallel between said grounding node and a ground terminal of a power supply, said first transistor being of high resistance and having its gate connected to a first clock voltage, said second transistor being of low resistance and having its gate connected to a second clock voltage, (c) a third transistor having a gate and having a source-to-drain path connected between said positive supply node and the positive voltage terminal of said power supply, said third transistor being of high resistance and having its gate connected to a third clock voltage, (d) clock means applying said first clock voltage to the gate of said first transistor at a given time in an operating cycle, and thereafter applying said third clock voltage to the gate of said third transistor later in such operating cycle, and control means responsive to said address for selectively applying said second clock voltage to the gate of said second transistor at a time in said operating cycle after said given time for sense amplifiers in a selected one of said groups, said second clock voltage not being applied to the second transistors in sense amplifiers in the reamining groups.

12. A device according to claim 11 wherein said memory cells are dynamic one-transistor memory cells.

13. A device according to claim 12 wherein said operating cycle is defined by an address strobe signal applied to said device.

* * * * *